(12) United States Patent
Hetzel et al.

(10) Patent No.: US 6,218,631 B1
(45) Date of Patent: *Apr. 17, 2001

(54) STRUCTURE FOR REDUCING CROSS-TALK IN VLSI CIRCUITS AND METHOD OF MAKING SAME USING FILLED CHANNELS TO MINIMIZE CROSS-TALK

(75) Inventors: Asmus Hetzel, Berlin; Erich Klink, Schoenaich; Juergen Koehl, Weil i.Schoenbuch; Dieter Wendel, Schoenaich, all of (DE); Parsotam Trikam Patel, Austin, TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,365

(22) Filed: Jul. 14, 1998

(30) Foreign Application Priority Data

May 13, 1998 (EP) .................................................. 98108690

(51) Int. Cl.[7] .............................. H01R 12/04; H05K 1/11
(52) U.S. Cl. .......................... 174/261; 361/792; 361/794
(58) Field of Search ................................... 174/261, 262, 174/36; 361/784, 792, 793, 794, 795

(56) References Cited

U.S. PATENT DOCUMENTS

| | | | |
|---|---|---|---|
| 3,351,816 | 11/1967 | Sear et al. | 317/101 |
| 3,370,184 | 2/1968 | Zuleeg | 327/565 |
| 3,560,893 | 2/1971 | Wen | 333/24.1 |
| 3,763,306 | * 10/1973 | Marshall | 174/115 |
| 3,876,964 | * 4/1975 | Balaster et al. | 333/84 M |
| 4,362,899 | * 12/1982 | Borrill | 174/36 |
| 4,381,420 | * 4/1983 | Elliott et al. | 174/34 |
| 4,498,122 | * 2/1985 | Rainal | 361/414 |
| 4,575,700 | 3/1986 | Dalman | 333/238 |
| 4,581,291 | 4/1986 | Bongianni | 428/381 |
| 5,184,210 | 2/1993 | Westbrook | 257/664 |
| 5,446,243 | 8/1995 | Crowder et al. | 174/250 |
| 5,466,893 | * 11/1995 | Nakatani et al. | 174/261 |
| 5,764,489 | * 6/1998 | Leigh et al. | 361/777 |
| 5,912,809 | * 6/1999 | Stigerwald et al. | 361/780 |

* cited by examiner

Primary Examiner—Jeffrey Gaffin
Assistant Examiner—Jeremy Norris
(74) Attorney, Agent, or Firm—Lynn L. Augspurger; Lawrence D. Cutter

(57) ABSTRACT

A structure for reducing cross-talk in VLSI circuits is disclosed. By filling voltage and ground metal lines in free or unused channels of VLSI chips and connecting them efficiently to the regular power image of the chip, the line to line coupling through vertical layers is reduced almost to zero and in-layer line to line coupling is also drastically reduced.

9 Claims, 3 Drawing Sheets

STRUCTURE FOR REDUCING CROSS-TALK IN VLSI CIRCUITS AND METHOD OF MAKING SAME USING FILLED CHANNELS TO MINIMIZE CROSS-TALK

FIELD OF THE INVENTION

The present invention generally relates to VLSI circuits, and, more particularly, to an arrangement for reducing cross-talk between and within metal planes of such circuits.

BACKGROUND OF THE INVENTION

Integrated circuits are continually being built and interconnected in denser and more complex packages. These circuits are being used to address high technology electronic applications and often include circuits that are designed to operate at high frequencies and at relatively high power levels. For example, many high performance digital computers are being implemented using VLSI (very large scale integration) circuits.

When used in a relatively dense electronic package, this type of circuitry must meet rigidly defined electrical and mechanical specifications. These specifications include line impedance, continuity, and minimal noise and cross-talk (cross-coupling) interferences.

Increasing device density has led to a decrease in the spacing between adjacent metal lines. Therefore, in deep-submicron technologies, cross-talk between parallel wires in the same wiring plane and between planes becomes increasingly important.

As metal lines are formed closer together, the potential for such capacitive and inductive interference between the lines increases. This interference is particularly troublesome when high frequency signals are propagated over adjacent lines in respective signal channels. The reliability of the electrical communication is thus reduced because the cross-talk acts as a source of noise which may introduce error in the communication.

Typically, adjacent wiring planes preferably have non-parallel wiring directions which reduces cross-talk to a negligible amount. However, planes i and i+2, i.e., a plane and the next but one plane, typically run in parallel direction and could generate cross-coupling.

BACKGROUND ART

In the prior art, this problem has been dealt with by constructing a metal line that is partially or totally shielded by a metal structure surrounding the metal line. A varying signal is propagated along the metal line, and the metal structure is coupled to ground potential. In combination, the two lines produce a negligible external electromagnetic field while also having a negligible susceptibility to external fields from adjacent lines. Examples of these prior art structures are, e.g., given in U.S. Pat. Nos. 3,560,893; 4,575,700; 3,370,184; 4,581,291 and 3,351,816.

Other prior art structures which have been designed to interconnect components of high performance digital computers, have included multiple layers consisting of conductors disposed in a polymer matrix. Those prior art structures have dielectric properties that allow high speed pulse propagation, but fail to significantly reduce the cross-talk of high speed signals in a highly dense electronic package.

Still other types of prior art structures include particularly selected shapes, materials, widths and thicknesses to implement the various planes comprising the structure. These prior art structures, however, have been unable to provide adequate high frequency and controlled impedance operation while sufficiently minimizing cross-talk.

U.S. Pat. No. 5,184,210 discloses an arrangement for interconnecting high density signals of integrated circuits having at least three layers. These layers comprise a signal layer for carrying signals in the electronic circuit, a dielectric layer of organic material disposed adjacent the signal layer, and a metallic reference layer. The layers are disposed such that the dielectric layer is arranged between the signal layer and the metallic reference layer. For providing controlled line impedance and for reducing cross-talk between the signals carried in the electronic circuit, the metallic reference layer includes uniformly spaced apertures which are situated in a slanted grid arrangement. Though cross-talk can be reduced by this structure, this solution is expensive and, what is even more disadvantageous, wastes a lot of space that could be used for additional wiring.

OBJECTS OF THE INVENTION

It is thus an object of the invention to provide a structure for reducing cross-talk in VLSI chips between parallel wires in the same plane and between planes.

It is another object of the invention to provide such a structure without wasting any space for additional wiring.

It is still another object of the invention to generate additional power routes where they are needed after wiring of the design.

It is still a further object of the present invention to provide a method for manufacturing the above mentioned structure.

These and other objects are accomplished by the structures described in claims 1 and 9 as well as by the method disclosed in claim 7.

Advantageous embodiments are laid down in the dependent claims.

SUMMARY OF THE INVENTION

As already mentioned above, in a VLSI chip, planes i and i+2 typically run in parallel direction and therefore can create cross-coupling. This cross-coupling between planes i and i+2 is negligible if shielded by wiring on layer i+1. There are dense areas on a chip where shielding by intermediate planes will always be assured, but there are also other areas, typically next to the borders of the chip, where this is not the case.

When integrating a custom or memory macro on a chip, the environment is not known in advance and it is uncertain whether internal macro wires in plane i will be shielded to chip interconnects in plane i+2 or not.

In order to reduce the loss of wirability to a minimum and at the same time improve the electrical properties of the circuit, the present invention proposes to fill voltage and/or ground (GND) metal lines in free and unused channels of VLSI chips and connect those efficiently to the regular power image.

Thus, vertical coupling between wiring layers (metal planes) i and i+2 is reduced nearly to zero. This applies to coupling both between internal macro wiring and chip level signal wiring. Furthermore, the clock skew due to different adjacencies for clock wires is reduced, since the clock line capacitance is constant as each adjacent channel is occupied by either signal or GND line.

BRIEF DESCRIPTION OF THE DRAWINGS

The invention will now be described in more detail in conjunction with the accompanying drawings, in which FIG. 1 schematically shows the wiring layer i+1 before filtering according to the invention, FIG. 2 schematically shows the same layer i+1 after filtering with GND connections to adjacent layers according to the invention, FIG. 3 schematically shows layer i+1 after filtering and removal of non connected small shield segments.

DETAILED DESCRIPTION OF THE INVENTION

Figure 1:
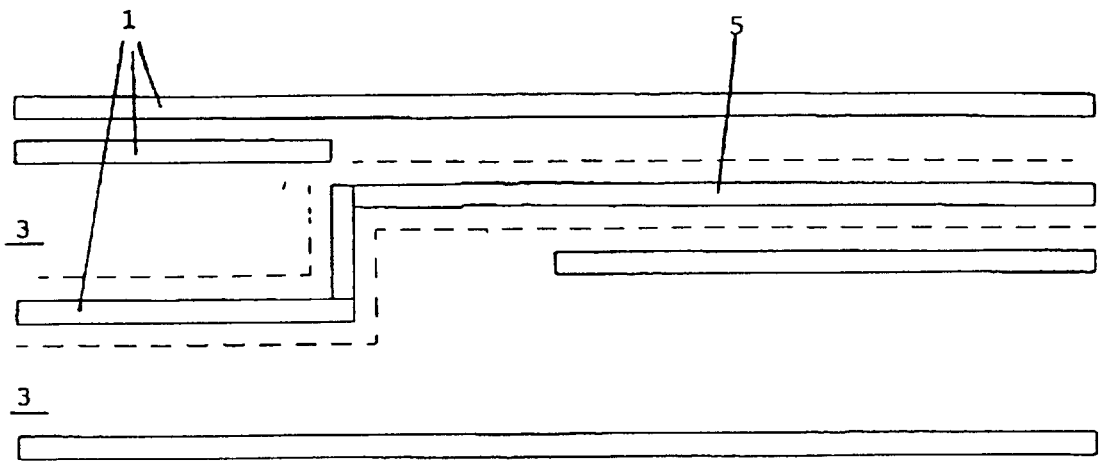

FIG. 1 exemplary shows metal plane i+1 of a VLSI chip. This plane contains wiring 1 that has been placed according to the design rules for this chip. As can be seen, there are empty areas 3 between the metal lines where no wiring is present. In case there exists a timing critical net 5 in this layer, i.e., a critical path that determines the cycle time, it is advantageous to block adjacent channels of timing critical nets by means of the implemented wiring tool, using for the critical nets a different wire type with a higher separation requirement (cf. the dashed lines in FIGS. 1 to 3) to reduce their net capacitance.

Figure 2:
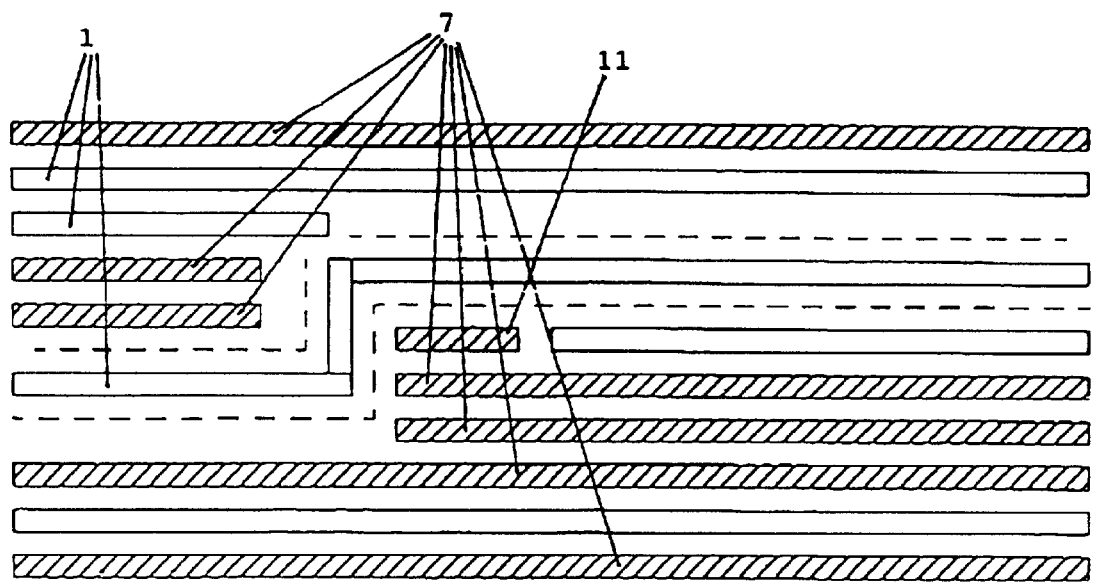

Next, as shown in FIG. 2, all empty areas 3, i.e., all empty tracks or unused channels of the respective plane, are filled with GND connections 7 to adjacent planes (not shown). It has to be mentioned that not only GND metal lines, but also voltage metal lines can be used to fill the unused channels. Thereby, alternating patterns are preferred to improve GND and voltage network.

Figure 3:
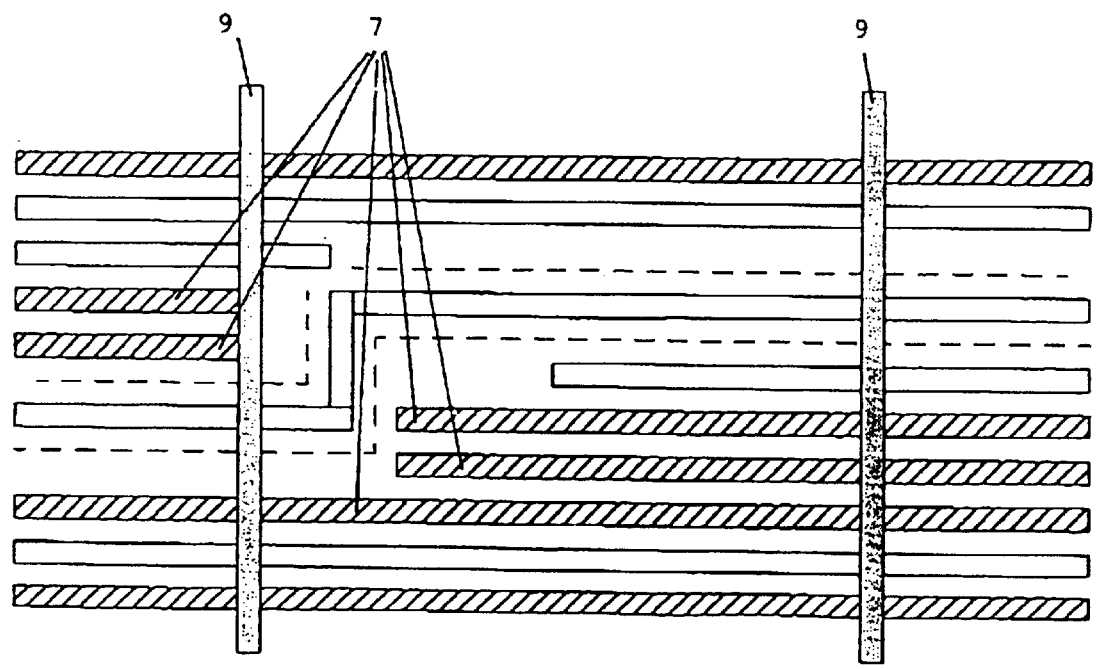

After having filled in the Voltage/GND segments, these are connected to standard Voltage/GND image lines. FIG. 3 shows this connections by indicating the Voltage/GND buses 9 on adjacent layer i.

There will always remain some short shield segments that cannot be connected to an adjacent plane (11 in FIG. 2), as there is no regular power bus in the plane below and above to connect to. These short, not connected segments are now removed from the respective plane, so that no floating segments remain.

Thus, a structure is created which shows improved electrical properties due to additional voltage and GND tracks. In addition to that, wiring running in the same direction is shielded, so that in-plane line to line coupling or cross-talk is drastically reduced. Furthermore the line to line coupling through vertical planes is reduced almost to zero.

An additional advantage of the above described filling method resides in the fact that new AC-DC return current paths are added, thus improving the efficiency of the on-chip capacitors. This leads to a significant reduction of voltage GND collapse on the chip.

The on-chip CLK line capacitance (C/mm) does not depend on accidental wiring adjacencies. Therefore, it is kept constant and hence, the CLK skew is also reduced.

Finally, by using the method according to the invention, the metal density will approach 50% in each metal plane, thereby improving the chip manufacturability yield.

The above mentioned method can be carried out automatically by a respective computer program. This program has to start with the following inputs:

placed and wired design list of timing critical nets list of planes to be filled and adjacency rule The wiring structure on a chip is highly unsymmetrical and typically contains neither voltage nor GND return or reference planes. On-chip reference planes cannot be built as they would waste wiring layers. Accordingly, in modern microprocessors all metal planes are required to carry logic wiring.

Usually inside each wiring plane voltage and GND lines are used as references and to carry return currents. Therefore, no microstrip or triplate wiring structures are available on-chip. Due to this reasons vertical and horizontal line to line coupling (cross-talk) is much higher especially excessive on longer lines.

Figure 4:
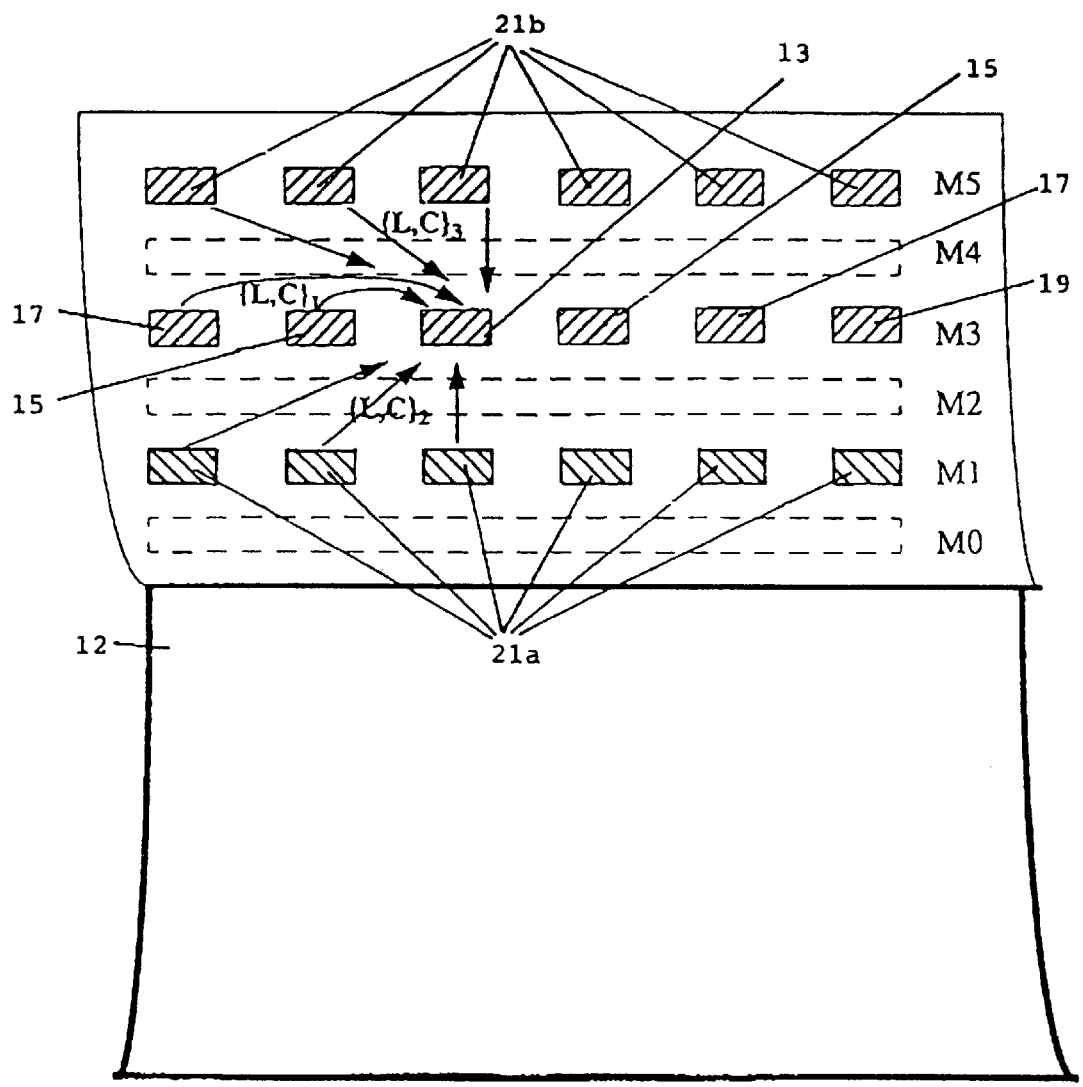
FIG. 4 depicts a cross section with chip metal layers illustrating cross-coupling.

FIG. 4 shows a cross section with chip metal planes on a silicon substrate 12, indicating horizontal and vertical coupling. A quiet signal line 13 is located in one of the metal planes present (M3 in this case). Within the same plane, active signal lines 15, 17, 19 are located in the 1st, 2nd and 3rd order neighbourhood of line 13. Additional signal lines 21a and 21b are arranged in adjacent metal planes M1 and M5. The arrows in FIG. 4 indicate the horizontal and vertical coupling signal line 13 is exposed to.

The line 13 sees coupling from all horizontal and vertical aggressor lines 15, 17, 19 which are the active and switching lines.

With the structure according to the invention the vertical coupling depicted in FIG. 4 is totally suppressed as the orthogonal planes can now serve as shield layers and the small gaps between the lines only allow for a negligible amount of cross-talk. This means that the shield functions almost as good as a full solid shield layer.

Furthermore the coupling inside one plane from adjacent neighbour lines 15, 17, 19 is also drastically reduced, as the line capacitance $C_0$ from the signal line to the vertical crossing lines is increased. The coupling coefficients $K_L$ and $K_C$ are reduced and the coupled voltage at the far end, $V_{fe}$, and at the near end, $V_{ne}$, into the quiet line 13 is significantly reduced. The relationship between these parameters is described by the following equations:

$K_c = C_{12}/(C_{12}+C_0)$
$K_L = L_{12}/(L_{12}+L_0)$
$V_{fe} = \text{const.}_1 (K_L - K_c)$
$V_{ne} = \text{const.}_2 (K_L + K_c)$ wherein $C_0$=capacitance to GND, voltage; $L_0$=self inductance; $L_{12}$=mutual inductance between lines 1 and 2; and $C_{12}$=mutual capacitance between lines 1 and 2.

Referring again to FIG. 4 this means that the L/C coupling from line 15 to the quiet line 13 in metal plane M3 is significantly reduced and that the L/C coupling from neighbour line 17 to quiet line 13 is almost totally zero.

Also improved are the return paths from the on-chip stabilization capacitors ($C_o$) which have to support the charge required by a high number of simultaneously switching elements and devices (e.g., latches, array macros, logic macros, general logic).

Figure 5:
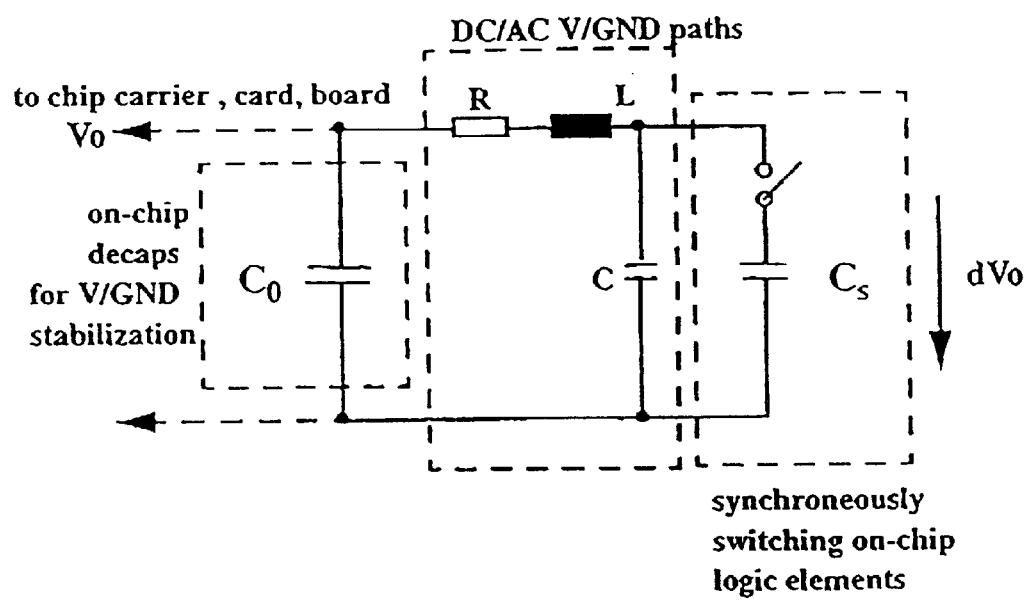
FIG. 5 shows a simplified equivalent circuit model for on-chip switching.

FIG. 5 illustrates the relationship between a switching circuitry modelled as switching capacitance $C_s$ and the on-chip stabilization decaps modelled as $C_o$. The stabilization decaps may consist of the parasitic on-chip capacitances (e.g., N-well), the circuit capacitances of quiet circuits and especially optimized and placed on-chip capacitances. As shown in FIGS. 2 and 3, a high number of additional voltage and/or GND metal lines can be filled in. These additional lines add a significant amount of new DC and AC return current paths. It follows that the DC resistance ("R" in FIG. 5) and the Voltage/GND loop inductance ("L" in FIG. 5) are drastically reduced.

The time response, which means the efficiency of the on-chip capacitors, is limited by high resistance and loop inductance of the voltage and GND lines (cf. "R" in FIG. 5). In general cases the limitation of the decap efficiency is around some few mm. This means that only decaps which are located in the neighbourhood of 1–2 mm are effective and can provide the required charge to the switching devices. If this charge is not sufficient, the voltage and GND on-chip collapses significantly. This can be seen from the following formula, which is valid for the Voltage/GND on-chip collapse $dV_0$, based on the equivalent circuit model shown in FIG. 5:

$$dV_0 = V_0 \times (C_s/(C_s+C_0)),$$

wherein $V_0$ represents the supply voltage.

Due to the filling process according to the invention the limiting resistance "R" (cf. FIG. 5) is significantly reduced and the area of effective decaps is significantly enlarged. As an example an improvement factor of more than 2 can be achieved. It follows that much more on-chip devices can bring their charge to the simultaneously switching devices and the voltage/GND collapse on-chip is significantly improved.

What is claimed is:

1. A structure for reducing cross-talk in VLSI circuits, comprising:

a VLSI circuit structure having at least three metal planes arranged one upon the other including an intermediate plane between adjacent metal planes and having channel wiring directions in each of said metal planes plane arranged to align for lines in said metal planes in said VLSI circuit structure in a generally orthogonal direction to lines in an adjacent plane for reducing cross talk between lines of said metal planes with areas of said intermediate plane which are not used for signal channels of said intermediate plane of said at least three metal planes are filled with lines carrying no signal information.

2. The structure according to claim 1, wherein said lines carrying no signal information comprise voltage and/or ground metal lines.

3. The structure according to claim 2, wherein said lines carrying no signal information are connected to a regular power image of said circuit.

4. The structure according to claim 3 wherein the areas of said intermediate plane which are not used for signal channels of said intermediate plane of said at least three metal planes but which surround time critical nets are not filled with lines carrying no signal information.

5. The structure according to claim 4, wherein said time critical nets are blocked with a different wire type different from a wiring type used for non time critical nets.

6. The structure according to claim 5, wherein said time critical nets are blocked with a wiring tool using said different wire type for the critical nets with a higher separation requirement.

7. The structure according to claim 6 wherein the cross-talk is reduced between planes of said metal planes running in parallel direction.

8. The structure according to claim 7 wherein the cross-talk is additionally reduced within a single plane of said metal planes.

9. A method for manufacturing a structure for reducing cross-talk in VLSI circuits, comprising a VLSI circuit structure having at least three metal planes arranged one upon the other including an intermediate plane between adjacent metal planes and having channel wiring directions in each of said metal planes plane arranged to align for lines in said metal planes in said VLSI circuit structure in a generally orthogonal direction to lines in an adjacent plane for reducing cross-talk between lines of said metal planes with areas of said intermediate plane which are not used for signal channels of said intermediate plane of said at least three metal planes filled with lines carrying no signal information, comprising the steps of a) blocking signal channels adjacent to timing critical nets,
   b) filling all free or unused signal channels in all planes with segments of lines carrying no signal information,
   c) connecting said lines to standard voltage/GND image lines; and
   d) removing all non connected segments.

* * * * *